United States Patent [19]

Blauschild

[11] Patent Number: 4,649,352

[45] Date of Patent: * Mar. 10, 1987

[54] DIFFERENTIAL AMPLIFIER CIRCUIT

[75] Inventor: Robert A. Blauschild, Los Altos, Calif.

[73] Assignee: Signetics Corporation, Sunnyvale, Calif.

[ * ] Notice: The portion of the term of this patent subsequent to Jul. 30, 2002 has been disclaimed.

[21] Appl. No.: 876,641

[22] Filed: Jun. 16, 1986

Related U.S. Application Data

[60] Continuation of Ser. No. 730,908, May 6, 1985, abandoned, which is a division of Ser. No. 525,181, Aug. 23, 1983, Pat. No. 4,532,479.

[30] Foreign Application Priority Data

Sep. 9, 1982 [JP] Japan ................................ 57-157246

[51] Int. Cl.[4] ............................................. H03F 3/45
[52] U.S. Cl. .................................... 330/261; 330/252
[58] Field of Search ................ 330/252, 255, 257, 261

[56] References Cited

U.S. PATENT DOCUMENTS 4,377,789 3/1983 Hoover ............................... 330/257
4,463,319 7/1984 Kearney .............................. 330/258

Primary Examiner—Gene Wan
Attorney, Agent, or Firm—R. J. Meetin; R. T. Mayer; J. Oisher

[57] ABSTRACT

An input portion (4, 6) of a differential amplifier circuit amplifies a differential input signal to produce an amplified signal between a pair of terminals. A summing section contains two complementary pairs of like-polarity amplifiers (13, 14 and 19, 20). Each has a first flow electrode, a second flow electrode, and a control electrode. A substantially constant bias voltage is supplied to the control electrodes of the first pair (13, 14) whose second electrodes are respectively coupled to the second electrodes of the second pair (19, 20). Their first electrodes are respectively coupled to the terminals and to corresponding impedance elements (11, 12). The control electrodes of the second pair are coupled together to receive a voltage dependent on the voltage at the second electrode of one (13) of the first pair so as to produce a representative output signal at the second electrode of the other (14) of the first pair.

14 Claims, 2 Drawing Figures

DIFFERENTIAL AMPLIFIER CIRCUIT

This is a continuation of U.S. patent application Ser. No. 730,908 filed May 6 1985, now abandoned, which is a division of U.S. patent application Ser. No. 525,181 filed Aug. 23, 1983 now U.S. Pat. No. 4,532,479.

FIELD OF USE

The present invention relates to differential amplifier circuits suitable for use in operational amplifiers, particularly as their input stages.

BACKGROUND ART

An operational amplifier in the form of a semiconductor integrated circuit generally consists of an input stage, a biasing circuit, and an output stage. The input stage is usually a differential amplifier circuit.

For example, consider a conventional operational amplifier in which the input portion of the differential-amplifier input stage consists of a pair of NPN input transistors whose bases receive the differential input signal and whose emitters are coupled together and through a current source to a low voltage supply. The collectors which provide an amplified differential signal are coupled through respective current sources to a high voltage supply. P. Gray et al illustrate such an operational amplifier in "Recent Advances in Monolithic Operational Amplifier Design," *IEEE Trans. Circs. and Systs.*, vol. CAS-21, May 1974, pp. 317–327.

DISCLOSURE OF THE INVENTION

In accordance with the invention, a differential amplifier circuit has an input portion and a summing section. The input portion amplifies a differential input signal to produce an amplified differential signal between a pair of terminals.

The summing (or subtracting) section of the circuit contains a pair of like-polarity first and second main amplifiers and a pair of like-polarity third and fourth main amplifiers complementary to the first and second amplifiers. As used herein, "complementary" generally means opposite-polarity type. Each main amplifier has a first flow electrode, a second flow electrode, and a control electrode for controlling current transmission between the flow electrodes. The charge carriers (either electrons or holes) that move between the flow electrodes of each amplifier suitably originate at its first electrode (e.g., emitter or source) and terminate at its second electrode (e.g., collector or drain).

The control electrodes of the first and second amplifiers are connected together to receive a common bias voltage. The control electrodes of the third and fourth amplifiers are connected together to receive a common control voltage dependent on the voltage at the second electrode of the first amplifier. The first electrodes of the third and fourth amplifiers are respectively coupled to the terminals of the input portion. The second electrodes of the first and third amplifiers are coupled together, while the second electrodes of the second and fourth amplifiers are coupled together for supplying an output signal representative of the input signal.

The present circuit further includes a pair of impedance elements. One of the impedance elements is coupled between a first voltage supply and the first electrode of the third amplifier, while the other impedance element is coupled between the first supply and the first electrode of the fourth amplifier.

The circuit also has a pair of current sources, of which one is coupled between a second voltage supply and the first electrode of the first amplifier, and the other is coupled between the second supply and the first electrode of the second amplifier. These current sources are typically impedance elements. Each impedance element is preferably a resistor.

In the input portion, the amplification of the input signal is performed with a pair of like-polarity input amplifiers coupled to the third and fourth main amplifiers and complementary to them.

The present circuit is preferably embodied using bipolar transistors. For example, each amplifier might be a single bipolar transistor having a base, an emitter, and a collector which are respectively the control, first, and second electrodes of that amplifier. As another example, each main amplifier might be a single bipolar transistor, and each input amplifier might contain a pair of bipolar transistors arranged in a Darlington configuration. Alternatively, the invention could utilize field-effect transistors (FET's) of the insulated-gate type or the junction type or of both types. Even further, both bipolar transistors and FET's might be used in the present circuit. In this case, N-channel FET's would be viewed as complementary to PNP transistors, and P-channel FET's would be viewed at complementary to NPN transistors.

DESCRIPTION OF THE PREFERRED EMBODIMENTS

Figure 1:
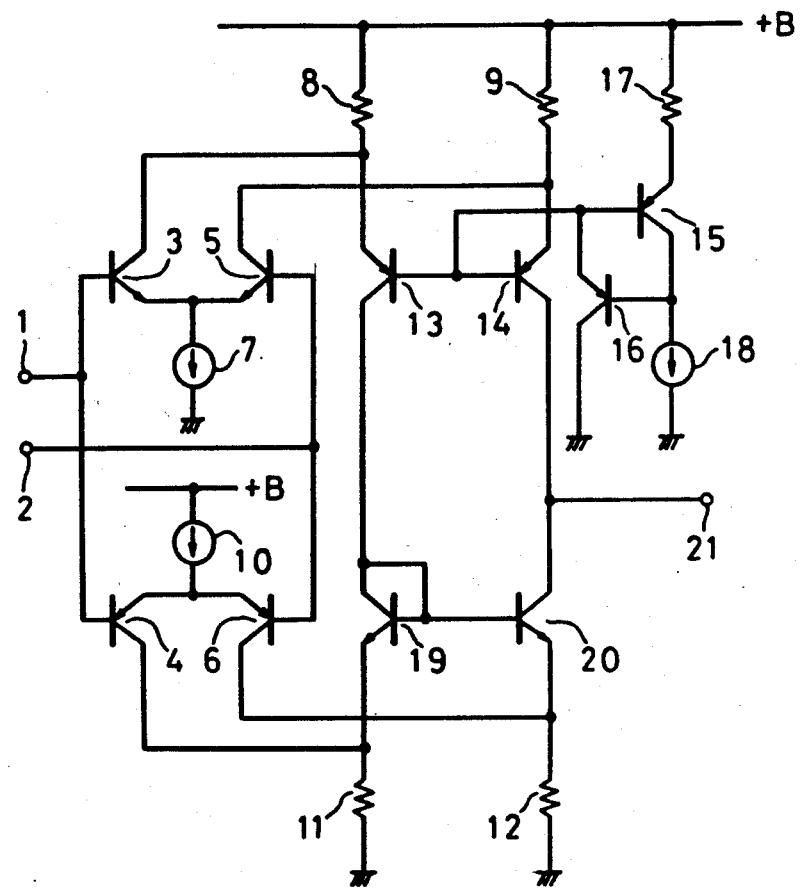
FIG. 1 is a circuit diagram of a differential amplifier circuit according to one embodiment of the present invention.

Referring to FIG. 1, it illustrates a bipolar differential amplifier circuit suitable for use as the input stage in an operational amplifier. This circuit consists of a composite input section for amplifying a differential input signal to produce a pair of amplified differential signals and a summing (or substracting) circuit for appropriately combining the amplified differential signals to produce a single output signal.

The composite input section receives the differential input signal at a pair of input terminals 1 and 2. Terminal 1 is connected to the bases of complementary transistors 3 and 4, and terminal 2 is connected to the bases of complementary transistors 5 and 6. The composite input section is divided into a pair of complementary differential input portions, each of which provides one of the amplified differential signals.

In a first of the input portions, a constant current source 7 is connected between ground reference (0 volt) and the interconnected emitters of transistors 3 and 5 which are identical NPN devices. The collectors of transistors 3 and 5 serve as terminals of this input portion from which its amplified differential signal is provided. A load resistor 8 is connected between the collector of transistor 3 and a positive power supply +B which provides a supply voltage $V_b$. An identical load resistor 9 is connected between the collector of transistor 5 and power supply +B. Resistors 8 and 9 act as current sources.

In the second input portion, a constant current source 10 is connected between supply +B and the interconnected emitters of transistors 4 and 6 which are identical PNP devices. The collectors of transistors 4 and 6 serve as terminals of the second input portion from which its amplified differential signal is provided. A load resistor 11 is connected between the collector of transistor 4 and ground reference. An identical load resistor 12 is connected between the collector of transistor 6 and ground reference.

The summing section contains a pair of identical common-base PNP transistors 13 and 14 whose emitters are connected respectively to the collectors of transistors 3 and 5 to receive the amplified differential signal from the first input portion. The emitters of transistors 13 and 14 are thereby respectively coupled through current-source resistors 8 and 9 to supply +B. A constant-voltage generator consisting of a PNP transistor 15, a PNP transistor 16, a resistor 17, and a constant current source 18 arranged as shown in FIG. 1 provides a constant bias voltage to the interconnected bases of transistors 13 and 14.

In the summing section, the collectors of transistors 13 and 14 are respectively connected to the collectors of a pair of identical common-base NPN transistors 19 and 20. The interconnected bases of transistors 19 and 20 are connected to the collector of transistor 19. As a result of the diode connection of transistor 19, the bases of transistors 19 and 20 receive the collector voltage of transistor 13. The output signal from the differential amplifier circuit is supplied from an output terminal 21 at the junction of the collectors of transistors 14 and 20. The emitters of transistors 19 and 20 are connected respectively to the collectors of transistors 4 and 6 to receive the amplified differential signal from the second input portion. The collectors of transistors 19 and 20 are thereby coupled through resistors 11 and 12 to ground reference. Transistors 13 and 14 serve as a load for transistors 19 and 20, and vice versa.

Letting $V_{BE}$ represent the standard voltage across the base-emitter voltage junction of an NPN transistor, transistor 3 or 5 is just conductive when its emitter-to-base voltage is about $1V_{BE}$. Likewise, transistor 4 or 6 is just conductive when its emitter-to-base voltage is about $1V_{BE}$. This leads to the requirement that power supply voltage $V_b$ be greater than $2V_{BE}$.

When the common-mode portion of the differential input signal is in the voltage range extending from approximately the low supply rail at ground reference to approximately the high supply rail at $V_b$, the output signal is representative of the input signal—i.e., the variation in the output signal at terminal 21 follows the voltage difference between terminals 1 and 2. Transistors 13, 14, 19, and 20 are always turned on so as to provide appropriate signal summation/conversion when the common-mode input portion is in the 0 to $V_b$ range. If the common-mode input portion rises above $V_b$ a point is soon reached at which the amplification becomes non-linear as first one and then the other of transistors 3 and 5 are driven into saturation. If the common-mode input portion drops below ground, a similar point is soon reached at which the amplification again becomes non-linear as first one and then the other of transistors 4 and 6 are likewise driven into saturation. The range from ground reference to $V_b$ for the common-mode portion of the differential input signal is a "safe" range over which the output signal closely follows the differential portion of the input signal.

Neglecting the small voltage drops across current sources 7 and 10, the 0 to $V_b$ range is divided into three generally distinct parts: a low range from ground reference to $V_{BE}$, a middle range from $V_{BE}$ to $V_b - V_{BE}$, and a high range from $V_b - V_{BE}$ to $V_b$ (which exceeds $2V_{BE}$). As the common-mode portion of the differential input signal drops below $1V_{BE}$, first one and then the other of transistors 3 and 5 turn off as their base-to-emitter voltages drop below the $1V_{BE}$ needed for conduction; transistors 4 and 6 are turned on. Thus, transistors 4 and 6 provide input signal amplification in the low range. In the middle range for the common-mode portion, transistors 3–6 are all turned on to provide input signal amplification. As the common-mode portion rises above $V_b - V_{BE}$, first one and then the other of transistors 4 and 6 turn off as their emitter-to-base voltages drop below the $1V_{BE}$ necessary for conduction; transistors 3 and 5 remain on. Consequently, transistors 3 and 5 provide input signal amplification in the high range.

The circuit of FIG. 1 operates generally as follows in amplifying a voltage difference between terminals 1 and 2. Assume that the common-mode portion of the input signal is in the middle range from $V_{BE}$ to $V_b - V_{BE}$ so that transistors 3–6 are turned on. Transistors 3 and 5 amplify the voltage difference to produce a current difference between their collectors. This current difference causes a corresponding current difference to occur between the emitters of transistors 13 and 14. Likewise, transistors 4 and 6 amplify the voltage difference to generate a current difference between their collectors. Neglecting the base currents to transistors 19 and 20 and momentarily ignoring the effect of transistors 4 and 6, transistors 19 and 20 act as a current mirror to produce a current through transistor 20 equaling the current through transistor 13. As a result, a partial current equal to the current difference between transistors 13 and 14 appears at terminal 21. If the common-mode input portion is in low range from 0 to $V_{BE}$ so that transistors 3 and 5 are turned off, this partial current does not appear at terminal 21.

Now momentarily ignoring the effect of transistors 3 and 5, transistor 19 appears to be a constant current source relative to the current difference between transistors 4 and 6. As a result, the portion of this current difference due to transistor 4 causes a voltage shift at the upper end of resistor 11. This voltage shift is reflected through transistors 19 and 20 so as to cause an equal voltage shift at the upper end of resistor 12 that, in turn, causes the current through transistor 20 to change by an amount corresponding to the portion of the current difference due to transistor 4. The portion of the current difference due to transistor 6 directly causes a corresponding change in the current through transistor 20. The current changes through transistor 20 are in the same direction and therefore add to produce another partial current at terminal 21. If the common-mode input portion is in the high range from $V_b - V_{BE}$ to $V_b$ so that transistors 4 and 6 are turned off, this partial current does not appear at terminal 21. This partial current and the partial current at terminal 21 due to transistors 3 and 5 are in the same direction and thus add to produce an output current corresponding to the sum of the current difference between transistors 3 and 5 and the current difference between transistors 4 and 6.

More particularly, consider a "small signal approximation" starting with the input balanced—i.e., terminals 1 and 2 are at the same voltage. Assume that the common-mode portion of the input signal is again in the middle range. A current $I_N$ flows through each of transistors 3 and 5, while a current $I_P$ flows through each of transistors 4 and 6. Ignoring the small base current for transistors 13, 14, 19, and 20, a current $I_S$ flows through transistors 13 and 19, while an equal current $I_S$ flows through transistors 14 and 20. The initial current through each of resistors 8 and 9 is $I_S+I_N$, and the initial current through each of resistors 11 and 12 is $I_S+I_P$.

The voltage at terminal 1 is now increased by an amount $\Delta V$, and the voltage at terminal 2 is decreased by the same amount $\Delta V$. The voltage at the emitters of transistors 3 and 5 remain constant since it changes only with the common-mode voltage. As a result, the current through transistor 3 increases to $I_N+\Delta I_N$, while the current through transistor 5 drops to $I_N-\Delta I_N$. The voltage at the emitters of transistors 4 and 6 also remains constant since it changes only with the common-mode voltage. The current through transistor 4 then drops to $I_P-\Delta I_P$, while the current through transistor 6 rises to $I_P+\Delta I_P$. The signal currents at the collectors of transistors 3 and 4 are opposite in phase, and the signal currents at the collectors of transistors 5 and 6 are likewise opposite in phase.

As seen from the collectors of transistors 3 and 5, resistors 8 and 9 respectively are high impedances whereas transistors 13 and 14 are respectively low impedances. This occurs because small changes in the collector currents of transistors 3 and 5 leading to corresponding small changes in the base-to-emitter voltages of transistors 13 and 14 cause large changes in their currents since their bases receive a fixed voltage. The currents through resistors 8 and 9 therefore remain approximately constant. The current through transistor 13 then drops to $I_S-\Delta I_N$, and the current through transistor 14 increases to $I_S+\Delta I_N$. The current through transistor 19 equals $I_S-\Delta I_N$ and is mirrored in transistor 20. The currents through resistors 11 and 12 then drop by $\Delta I_N$.

Resistor 11 appears as a low impedance to the collector of transistor 4 in contrast to transistor 13 which is seen as a high impedance through diode-connected transistor 19. This occurs because a small change in the collector voltage of transistor 4 leading to a corresponding small change in the collector voltage of transistor 13 does not cause its current to change very much. Because of the diode connection of transistor 19, it provides only a substantially constant voltage drop across its base-to-emitter junction and is largely "transparent" to transistor 4 insofar as impedances are concerned. Consequently, transistor 4 largely does not affect the current of $I_S-\Delta I_N$ through transistor 19.

Since the current through transistor 4 is $\Delta I_P$ lower, the current through resistor 11 drops the same. That is, the current through resistor 11 is $I_S+I_P-\Delta I_N-\Delta I_P$. The voltage across resistor 11 then drops $R(\Delta I_N+\Delta I_P)$ where R is the resistance of resistor 11 or 12. As with transistor 19, the base-to-emitter voltage of transistor 20 remains approximately constant. Accordingly, the base voltage of transistors 19 and 20 drops $R(\Delta I_N+\Delta I_P)$, causing the voltage across resistor 12 to drop the same amount. The current through resistor 12 then falls to $I_S+I_P-\Delta I_N-\Delta I_P$.

As seen from the collector of transistor 6, resistor 12 is a high impedance, whereas transistor 20 is a low impedance. This occurs because a small change in the collector voltage of transistor 6 leading to a corresponding small change in the base-to-emitter voltage of transistor 20 causes its current to change by a large amount. The current through transistor 20 then drops $2\Delta I_P$, one $\Delta I_P$ because of the current drop through transistor 4 and the other $\Delta I_P$ because of the current increase through transistor 6. That is, the current through transistor 20 equals $I_S-\Delta I_N-2\Delta I_P$. Since the current through transistor 14 is $I_S+\Delta I_N$, the amplified output current at terminal 21 is $2\Delta I_N+2\Delta I_P$.

As before, the factor of $2\Delta I_N$ does not appear at terminal 21 if the common-mode input signal is in the low range. The output current is then $2\Delta I_P$. The reverse occurs if the common-mode input signal is in the high range.

In actual operation, the currents through resistors 8 and 9 do change slightly. The change in current through transistor 4 also causes a slight change in the current through transistor 19. However, these are "second-order" effects that can generally be accounted for by suitably adjusting the bias voltage to the bases of transistors 13 and 14.

In a preferred embodiment, power supply $+B$ is about 1.5 to 1.8 volts. The bias voltage provided to the bases of transistors 13 and 14 is about 1.2 volts. Transistors 3 and 5 each have an amplification of 50 to 300. Transistors 4 and 6 each have an amplification of 30 to 120. Resistors 8, 9, 11, 12, and 17 are each 5,000 ohms. Current sources 7 and 10 are 5 to 20 microamperes, typically 10 microamperes. Current source 18 is 20 microamperes.

While the modulated current mirror consisting of transistors 19 and 20 and resistors 11 and 12 in FIG. 1 enables supply voltage $V_b$ to have a very low value, other versions of a modulated current mirror could be used in FIG. 1 in accordance with the invention. As one example, the diode connection of transistor 19 is replaced with a further NPN transistor base-emitter connected between the collector and base of transistor 19 so that the voltage at the bases of transistors 19 and 20 differs from the voltage at the collector of transistor 13 by about $1V_{BE}$. This further transistor has its collector tied to supply $+B$, while a current source might be coupled between its emitter and ground. This version reduces the small mirroring error that results from driving the bases of transistors 19 and 20 with part of the current through transistor 13 but requires that voltage $V_b$ be about $1V_{BE}$ greater than in FIG. 1.

As a second example, a modulated Wilson current mirror is created by connecting transistor 20 rather than transistor 19 as a diode and utilizing a further NPN transistor whose emitter is connected to the collector of transistor 20 and whose collector is connected to the collector of transistor 14 to provide the output signal; this further transistor has its base connected to the interconnected collectors of transistors 13 and 19 so that the voltage at the bases of transistors 19 and 20 is $1V_{BE}$ different from the collector voltage of transistor 13. Another diode-connected NPN transistor is preferably collector-emitter coupled between the respective collectors of transistors 13 and 19 to provide better matching. This second alternative greatly reduces the current mirroring error but again requires that $V_b$ be about $1V_{BE}$ higher.

As a third example of a modulated current mirror suitable for use in FIG. 1, a further diode-connected NPN transistor is collector-emitter connected between the respective collectors of transistors 13 and 19 so that the voltage at the bases of transistors 19 and 20 is again about $1V_{BE}$ below the collector voltage of transistor 13; another NPN transistor has its emitter connected to the collector of transistor 20, its collector connected with the collector of transistor 14 to provide the output signal, and its base connected to the base of the further diode-connected transistor. This third alternative provides improved transient response at the expense of $V_b$ being about $1V_{BE}$ greater.

There are several major points common to all of the modulated current mirrors described above, including that of FIG. 1. Ignoring the effect of transistors 4 and 6, the collectors of transistors 3 and 5 see resistors 8 and 9 respectively as high impedances and transistors 13 and 14 respectively as low impedances. Each modulated current mirror then mirrors the current through transistor 13 so as to produce a partial output current corresponding to the differential current between transistors 3 and 5. Ignoring the effect of transistors 3 and 5, transistor 13 is a constant current source. The collector of transistor 4 then sees a high impedance in the direction of transistor 13 and a low impedance in the direction of resistor 11 which provides a voltage level shift that is transmitted to resistor 12. This causes a current change through resistor 12 that corresponds to the portion of the current difference due to transistor 4 and is transmitted as a partial current to the output. Again ignoring the effect of transistors 3 and 5, the collector of transistor 6 sees resistor 12 as a high impedance and transistor 20 as a low impedance. A partial current corresponding to the current difference due to transistor 6 is thereby directly transmitted to the output. When the effects of transistors 3-6 are considered together, these partial currents are summed to produce the output current as described above.

Although the supply voltages were described above as positive voltage $V_b$ and ground reference, this was done only for the purpose of facilitating the explanation. More generally, various combinations of positive and/or negative power supplies or a combination of ground reference and a negative power supply may provide the supply voltages.

Figure 2:
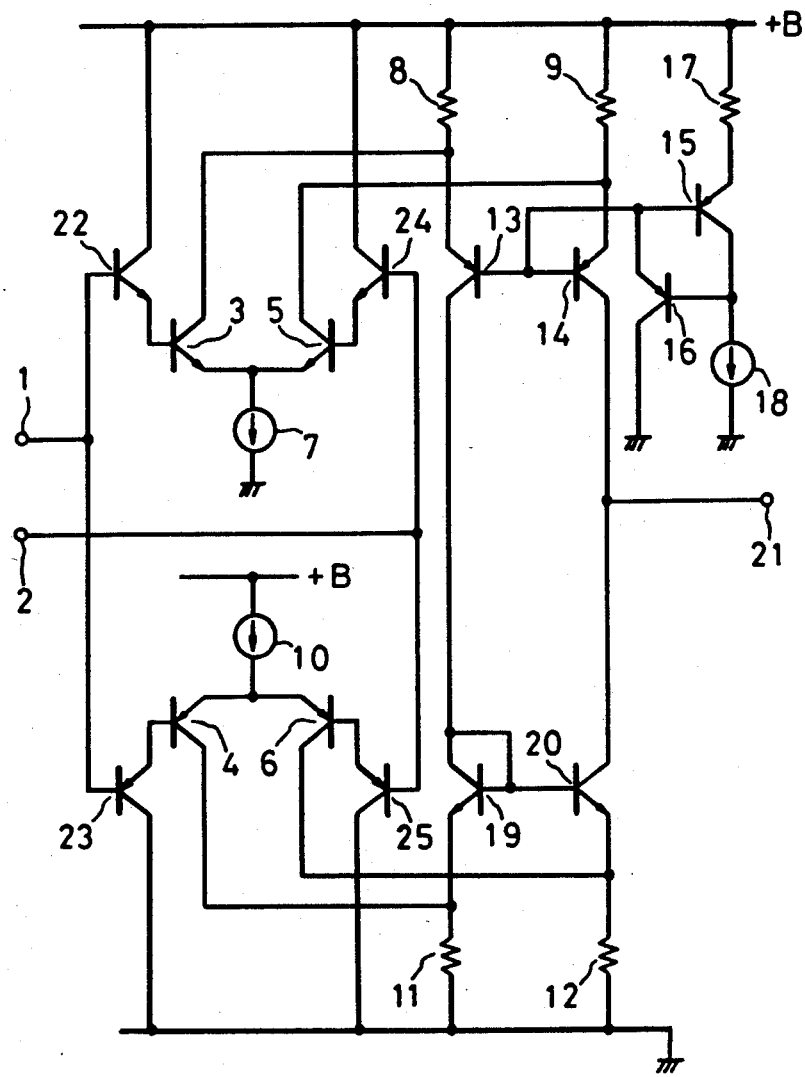
FIG. 2 is a circuit diagram of a differential amplifier circuit according to another embodiment of the present invention.

Turning to FIG. 2, it shows another differential amplifier circuit suitable for use as the input stage of an operational amplifier. Many of the elements in FIG. 2 are configured the same as in FIG. 1 and are thereby labeled with the same reference symbols. As in FIG. 1, the input stage of FIG. 2 has a summing section consisting of transistors 13, 14, 19, and 20 that operate in conjunction with resistors 8, 9, 11, and 12 and a constant-current generator consisting of elements 15-18. These portions of FIG. 2 are configured the same and operate the same as in FIG. 1. Accordingly, they will largely not be further discussed here.

In FIG. 2, the differential input signal at terminals 1 and 2 is again provided to a pair of complementary differential input portions. The difference between FIGS. 1 and 2 is that each transistor 3, 4, 5, or 6 is combined with a like-polarity bipolar transistor in FIG. 2 to achieve a Darlington configuration. This provides greater amplification than in FIG. 1. In particular, terminal 1 in FIG. 2 is connected to the bases of complementary transistors 22 and 23 whose emitters are respectively connected to the bases of transistors 3 and 4. Terminal 2 is connected to the bases of complementary transistors 24 and 25 whose emitters are respectively connected to the bases of transistors 5 and 6. The collectors of transistors 22 and 24 which are NPN devices are tied to power supply +B. The collectors of transistors 23 and 25 which are PNP devices are similarly connected to ground. Current sources 7 and 10 are connected the same as in FIG. 1.

One of the differential input portions in FIG. 2 consists of transistors 3, 5, 22, and 24. The collectors of transistors 3 and 5 serve as terminals for this first input portion from which an amplified differential signal is provided to the emitters of transistors 13 and 14, respectively. The second differential input portion consists of transistors 4, 6, 23, and 25. The collectors of transistors 4 and 6 serve as terminals for the second input portion from which an amplified differential input signal is provided to the emitters of transistors 19 and 20, respectively.

Transistors 22 and 24 are just conductive when their base-to-emitter voltages are about $1V_{BE}$. They are also conductive when transistors 3 and 5 are respectively conductive. Likewise, transistors 23 and 25 are just conductive when their emitter-to-base voltages are about $1V_{BE}$. They are also conductive when transistors 4 and 6 are respectively conductive. This leads to the requirement that power supply voltage $V_b$ be greater than $4V_{BE}$. In contrast to FIG. 1, the difference amplifier circuit of FIG. 2 provides increased amplification at the expense of a higher power supply voltage.

When the common-mode portion of the differential signal is in the range extending from approximately the low supply rail at ground reference to approximately the high supply rail at $V_b$, the variation in the output signal at terminal 21 in FIG. 2 follows the voltage difference between terminals 1 and 2. The 0 to $V_b$ range is divided into three generally distinct parts: a low range from 0 to $2V_{BE}$, a middle range from $2V_{BE}$ to $V_b-2V_{BE}$, and a high range from $V_b-2V_{BE}$ to $V_b$ (which exceeds $4V_{BE}$). As the common-mode voltage drops below $2V_{BE}$, first one and then the other of the transistor pair 3 and 22 and the transistor pair 5 and 24 turn off as their individual base-emitter voltages drop below $1V_{BE}$. Transistors 4, 6, 23, and 25 are turned on and provide input signal amplification in the low range. In the middle range, transistors 3-6 and 22-25 are all turned on to provide input signal amplification. As the common-mode voltage rises above $V_b-2V_{BE}$, first one and then the other of transistor pair 4 and 23 and transistor pair 6 and 25 turn off as their individual emitter-base voltages drop below $1V_{BE}$. Transistors 3, 5, 22, and 24 remain on to provide input signal amplification in the high range. As in FIG. 1, the circuit of FIG. 2 has rail-to-rail capability for the common-mode portion of the input signal. The summing section and the second input portion (containing transistors 4 and 6 in FIG. 1 or transistors 4, 6, 23, and 25 in FIG. 2) form an important sub-combination of the present input stage. While this sub-combination does not achieve the rail-to-rail input capability of the full input stage, the sub-combination is a useful differential-amplifier building block.

Each of the various embodiments of the present differential amplifier circuit is preferably fabricated as a monolithic integrated circuit according to conventional planar processing techniques. PN junction isolation is typically used to separate active device regions on a semiconductor wafer.

While the invention has been described with reference to particular embodiments, this description is solely for the purpose of illustration and is not to be construed as limiting the scope of the invention claimed below. For example, semiconductor elements of opposite polarity to those described above may be employed to accomplish the same results. Some or all of the bipolar transistors may be replaced with FET's. Thus, various modifications, changes, and applications may be made by those skilled in the art without departing from the true scope and spirit of the invention as defined by the appended claims.

What is claimed is:

1. A differential amplifier circuit comprising:
   a differential input portion for amplifying a differential input signal to produce an amplified differential signal taken between a pair of terminals thereof; and
   first, second, third, and fourth main amplifiers, each having a first flow electrode, a second flow electrode, and a control electrode for controlling current transmission between the flow electrodes, the first and second amplifiers being of like polarity with their control electrodes connected together for receiving a substantially constant bias voltage, the third and fourth amplifiers being of like polarity with their control electrodes connected together for receiving a control voltage dependent on the voltage at the second electrode of the first amplifier, the third and fourth amplifiers being complementary to the first and second amplifiers, the first electrodes of the third and fourth amplifiers respectively coupled to the terminals, the second electrodes of the first and third amplifiers coupled together, and the second electrodes of the second and fourth amplifiers coupled together for supplying an output signal representative of the input signal.

2. A circuit as in claim 1 further including (1) an impedance element coupled between a first voltage supply and the first electrode of the third amplifier and (2) an impedance element coupled between the first supply and the first electrode of the fourth amplifier, the first electrodes of the first and second amplifiers coupled to a second voltage supply.

3. A circuit as in claim 2 further including (1) a current source coupled between the second supply and the first electrode of the first amplifier and (2) a current source coupled between the second supply and the first electrode of the second amplifier.

4. A circuit as in claim 3 wherein each current source is an impedance element.

5. A circuit as in claim 4 wherein each impedance element is a resistor.

6. A circuit as in claim 3 wherein charge carriers that move between the flow electrodes of each amplifier originate at its first electrode and terminate at its second electrode.

7. A circuit as in claim 3 wherein the control electrode of the third amplifier is coupled to its second electrode.

8. A circuit as in claim 7 wherein the control and second electrodes of the third amplifier are connected together so that it acts like a diode.

9. A circuit as in claim 3 wherein the input portion comprises:
   a pair of like-polarity input amplifiers, each having a control electrode for controlling current transmission between first and second flow electrodes thereof, the first electrodes of the input amplifiers coupled together, the input signal being supplied to the control electrodes of the input amplifiers whose second electrodes are the terminals; and
   an input current source coupled to the first electrodes of the input amplifiers.

10. A circuit as in claim 9 wherein charge carriers that move between the flow electrodes of each amplifier originate at its first electrode and terminate at its second electrode under the control of its control electrode.

11. A circuit as in claim 10 wherein: the input amplifiers are complementary to the third and fourth main amplifiers; and the input current source is coupled to the second supply.

12. A circuit as in claim 11 wherein each amplifier is a bipolar transistor having a base, an emitter, and a collector which are respectively the control, first, and second electrodes of that amplifier.

13. A circuit as in claim 3 wherein the control voltage follows the voltage at the second electrode of the first amplifier.

14. A circuit as in claim 1 further including means for providing the bias voltage at its substantially constant value.

* * * * *